Aug. 26, 1958

L. A. UMBACH, JR 2,849,610

ELECTRICAL ISOLATION APPARATUS

Filed Jan. 27, 1954

INVENTOR.
Louis A. Umbach, Jr.
BY Morris A. Rabkin
ATTORNEY

United States Patent Office 2,849,610

Patented Aug. 26, 1958

2,849,610

ELECTRICAL ISOLATION APPARATUS

Louis A. Umbach, Jr., Youngstown, Ohio, assignor, by mesne assignments, to the United States of America as represented by the Secretary of the Air Force Application January 27, 1954, Serial No. 406,447

4 Claims. (Cl. 250—36)

This invention relates to electronic apparatus, and more particularly to an electronic circuit apparatus for isolating low and high power circuits.

Many electronic generators and amplyifiers derive their driving signals from low power amplifiers or generators. In some applications these high power circuits reflect a disturbance back into the low power driving stage. This may have deleterious effects such as a severe distortion of the input signal to the high power stage. Furthermore, high powers may be needlessly drawn from the low power stages when low power would suffice, necessitating the use of large components where smaller and less expensive ones will do. Particularly this is the case in high powered pulse generators such as blocking oscillators wherein a large grid current must flow during the power pulse, and only a relatively low power pulse is necessary to initiate the blocking oscillator pulsing cycle.

Accordingly, the present invention provides an electronic circuit apparatus for alleviating these difficulties. A balanced impedance element, such as the secondary of a known hybrid coil, is connected at each end to two equal impedances, one of which is the input to the high powered stage. The balanced point of the balanced impedance element, for example, the center tap of the hybrid coil secondary, is connected to complete the input circuit of the high powered stage. The driving stage may be connected as the input to the balanced impedance, as for example, to the input coil winding of a hybrid coil. The circuit arranged in this manner is effectively a balanced bridge comprising each half of the balanced impedance elements, the input circuit of the high power stage, and the other impedance that is equal to the input impedance of the high power stage. Hence, signals from the high powered stage will be balanced in the bridge circuit, and will not reflect a disturbance back into the low powered driving stage.

An object of this invention is to provide an electronic apparatus that will prevent the reflection of disturbances back into preceding electronic circuit stages.

A further object of this invention is to provide an electronic apparatus that will effectively isolate low powered driving stages from high powered driven stages.

A still further object of this invention is to provide an electronic isolation apparatus using a hybrid coil.

A still further object of this invention is to provide an apparatus for electrical oscillation of a triggered blocking oscillator from a source of trigger pulses.

A still further object of this invention is to provide an electronic apparatus that will prevent the reflection of disturbances from electronic apparatus having a feedback path.

Other objects and advantages of the present invention will, of course, become apparent and immediately suggest themselves to those skilled in the art to which the invention is directed from a reading of the following specification in connection with the accompanying drawings in which.

Figure 1:
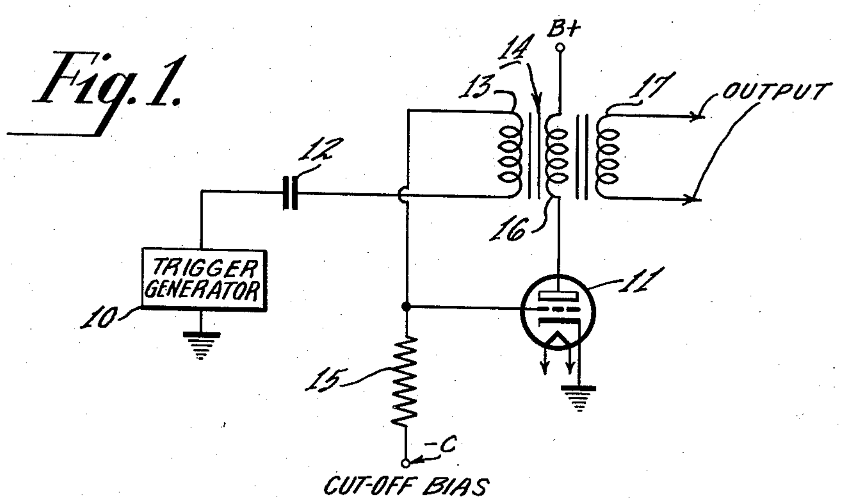
Figure 1 is a schematic circuit diagram of a triggered blocking oscillator.

Referring in particular to Figure 1, a triggered blocking oscillator is shown to indicate the setting of the improvement afforded by the circuit apparatus of the present invention. A trigger generator 10 supplies an input driving pulse to the grid of an electrode tube 11 through a grid blocking capacitor 12 and the feedback winding 13 of a pulse transformer 14. The tube 11 is normally biased to cut-off by means of a (c−) cut-off bias supply (not shown) which is coupled to the grid of the tube 11 through a grid resistor 15. The cathode of the tube 11 is connected to ground directly. Another winding 16 of the pulse transformer 14 is connected into the plate circuit of the tube 11, and plate potential is supplied through this winding from a (B+) source (not shown). The blocking oscillator output may be taken from the plate circuit by means of an output winding 17 on the pulse transformer 14.

In operation the trigger generator 10 supplies a pulse of sufficient magnitude to overcome the cut-off bias applied to the tube grid through the grid resistor 15. Making the tube conduct initiates the blocking oscillator's cycle. Plate current starts to flow, and because of the close regenerative coupling between the plate winding 16 and the feedback winding 13 of the pulse transformer 14, the grid of the tube is driven more positive so that a large plate current flows. The process is cumulative with the result that the tube very quickly begins to draw large currents, and the trigger pulse supplied by the trigger generator 10 is not needed to sustain conduction. However, the trigger generator 10 is directly connected in series with the grid of the tube 11 so that a large current must flow through it. Thus, large trigger tubes and components are required in the generator 10, and circuit complications may be introduced. As the plate current reaches saturation, the positive voltage applied to the grid decreases and the grid blocking capacitor 12 discharges. The field around the plate circuit winding 16 of the pulse transformer 14 collapses and consequently induces a voltage into the feedback winding 13. This will drive the grid of the tube 11 more and more negative until the tube is cut off. Therefore, a large current in the reverse direction flows through the circuit comprising the trigger generation 10, grid blocking capacitor 12, feedback winding 13, and grid resistor 15 having the same deleterious effects as mentioned previously.

Figure 2:
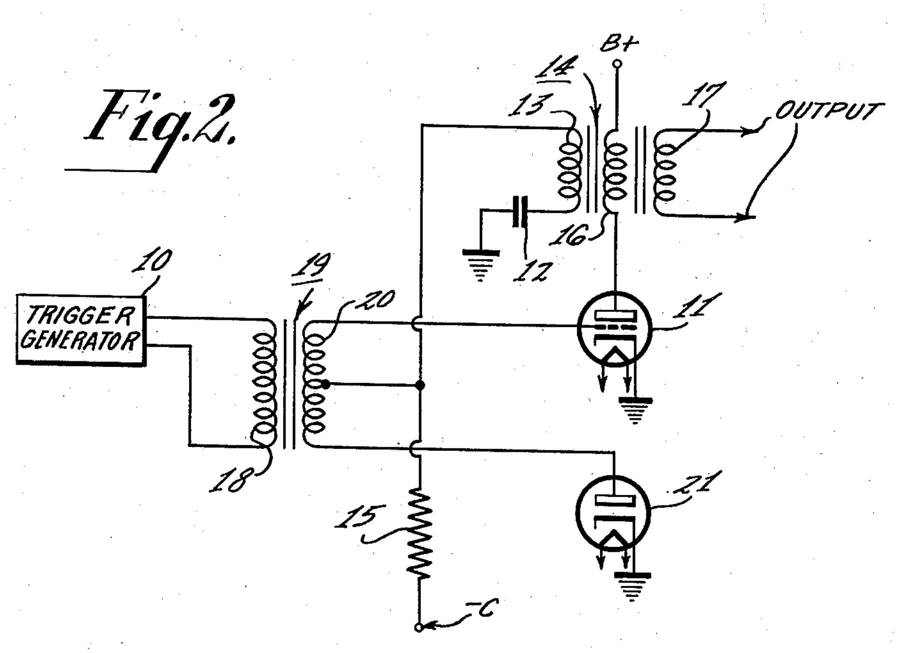
Figure 2 is a schematic circuit diagram of a triggered blocking oscillator incorporating an embodiment of the electrical isolating apparatus according to this invention.

In Figure 2 an embodiment of the present invention is illustrated in association with the triggered blocking oscillator described above. The trigger generator 10 is connected to the input winding 18 of an input transformer 19 that is connected to operate according to the principle of the hybrid coil. Across the accurately balanced, center-tapped secondary 20 of the transformer 19, two circuits are connected which have similar impedances to ground. One circuit is the grid-cathode circuit of the blocking oscillator tube 11; the other is the circuit of an electron tube 21 shown here as a diode. The impedance characteristics of the diode should be nearly identical with the impedance characteristics of the grid-cathode circuit of the blocking oscillator tube 11. The feedback path comprising the blocking capacitor 12, and the feedback winding 13 of the pulse transformer 14 is completed through the center-tap and half of the secondary winding of the input transformer 19.

The circuit connected to the secondary 20 of the input transformer 19 provides a balanced bridge circuit for the driving and input circuit to the blocking oscillator stage. The feedback current divides at the center-tap on the secondary winding 20 of input transformer 19; half goes into the grid and the other half goes into the diode 21. Since the bridge is balanced, no potential appears across the end points of the secondary winding 20. The magnetic flux produced in the core of the input transformer 19 by secondary voltages cancel, and therefore, no voltage can be reflected back into the trigger generator 10. However, the pulsing voltages from the trigger generator 10 still appears on the grid of the blocking oscillator tube 11, since the input signal will divide equally between the gird-cathode circuit of the blocking oscillator tube 11 and the circuit of the diode 21. The operation of the plate and output circuits of the blocking oscillator stage will not be affected by the operation of the input transformer 19, and an output pulse will be produced in the same manner as previously described.

The electronic isolation apparatus is described with reference to a blocking oscillator circuit. However, the apparatus may have application to other driven circuits where subsequent circuit must not reflect a disturbance back into preceding circuits.

What is claimed is:

1. In a blocking oscillator having an inductive feedback winding, the combination comprising a trigger generator, a transformer for coupling said trigger generator to the input of said blocking oscillator, an output winding on said transformer, and a center tap on said output winding having said feedback winding connected thereto, one end of said output winding being connected to said input of said blocking oscillator, said input having a certain impedance with respect to ground, an opposite end of said output winding being connected to ground through an impedance element so that the impedance of said ends with respect to ground is balanced.

2. A blocking oscillator according to claim 2 wherein said impedance element connected to said opposite end of said output winding comprises an electron tube.

3. An apparatus for electrically isolating a triggered blocking oscillator from a source of trigger pulses, said oscillator comprising a tube having a grid circuit, said apparatus comprising a hybrid coil having an input winding and a balanced output winding, means for connecting said source of trigger pulses to said input winding, said grid circuit of said blocking oscillator being connected to one end of said balanced output winding, an impedance equal to the impedance of said grid circuit connected to the other end of said output winding, and a feedback path from said blocking oscillation connected to a balance point on said balanced output winding.

4. An apparatus according to claim 3 wherein said impedance connected to the other end of said grid circuit comprises a second electronic tube.

References Cited in the file of this patent

UNITED STATES PATENTS

| | | |
|---|---|---|
| 1,432,863 | Johnson | Oct. 24, 1922 |
| 1,450,254 | Espenschied | Apr. 3, 1923 |
| 1,548,062 | Pierce | Aug. 4, 1925 |
| 1,605,972 | Nyquist | Nov. 9, 1926 |
| 1,643,075 | Latour | Sept. 20, 1927 |
| 1,662,888 | Herman | Mar. 20, 1928 |
| 1,665,683 | Zuschlag | Apr. 10, 1928 |
| 1,809,839 | Field | June 16, 1931 |
| 2,227,075 | Geiger | Dec. 31, 1940 |
| 2,463,685 | Fredendall et al. | Mar. 8, 1949 |
| 2,542,066 | Varela | Feb. 20, 1951 |
| 2,594,167 | Herold | Apr. 22, 1952 |
| 2,610,298 | Zaloudek | Sept. 9, 1952 |